(12) United States Patent
Sumino et al.

(10) Patent No.: US 6,414,393 B2
(45) Date of Patent: Jul. 2, 2002

(54) SEMICONDUCTOR DEVICE

(75) Inventors: Jun Sumino; Tadashi Omae; Satoshi Shimizu, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,766

(22) Filed: Dec. 20, 2000

(30) Foreign Application Priority Data

Jun. 19, 2000 (JP) .......................................... 2000-182944

(51) Int. Cl.[7] .......................... H01L 23/48; H01L 23/52; H01L 29/40
(52) U.S. Cl. ...................... 257/758; 257/760; 257/784; 257/786; 257/750
(58) Field of Search ................................. 257/758, 750, 257/784, 786, 760

(56) References Cited

U.S. PATENT DOCUMENTS 6,103,626 A * 8/2000 Kim ............................ 257/758

* cited by examiner

*Primary Examiner*—Tom Thomas
*Assistant Examiner*—Thien F Tran
(74) *Attorney, Agent, or Firm*—McDermott, Will & Emery

(57) ABSTRACT

The invention provides a semiconductor device having a multilayer wiring structure in which a plurality of layers are provided on a substrate and in which a connection wiring is formed on each layer, wherein a dummy pattern almost as high as the connection wiring is provided in a predetermined region of each layer so that an outer peripheral portion of the dummy pattern is adjacent to the connection wiring, the dummy pattern is formed linearly at least on the outer peripheral portion, and a distance between a linearly formed portion and a portion inside of the linearly formed portion is set to be equal to or narrower than a distance between the connection wiring and the linearly formed portion.

5 Claims, 3 Drawing Sheets

SEMICONDUCTOR DEVICE

BACKGROUND OF THE INVENTION

The present invention relates to a semiconductor device provided with a multilayer wiring structure in which a plurality of layers are provided on a substrate and in which predetermined elements and a connection wiring for electrically connecting the elements are formed on each layer In the recent years, the miniaturization of various types of wirings such as a connection wiring for mutually connection among the gate electrode of an MOS transistor, an ohmic electrode to elements and the elements, has progressed with the miniaturization of semiconductor element. As an internal structure of the semiconductor device capable of satisfying such miniaturization, a multilayer wiring structure which is a stacked structure, is widely employed. This multilayer wiring structure has advantages in that chip size can be made smaller, a LSI can be made further multifunctional and accelerated and the degree of freedom in circuit design can be improved. On the other hand, the multilayer wiring structure has disadvantages in that it has the difference in height between a portion which a connection wiring for mutually connecting elements exists and a portion on which no such connection wiring exists and the difference increases as connection wirings increasingly become multilayered. Such an increase of the difference in height may cause a malfunction such as, for example, the disconnection of a connection wiring formed or an upper layer. Conventionally, it is well known that a dummy pattern having almost the same height as that of a connection wiring is provided on a portion on which no connection wiring exists, so as to suppress the difference in height.

FIG. 7 shows one example of a dummy pattern formed on a conventional semiconductor device having a multilayer wiring structure. A dummy pattern 73, which is almost as high as two connection wirings 72a and 72b formed on a substrate 71 and which is made of aluminum alloy, is provided so that the outer peripheral portion of the pattern 73 is adjacent to the connection wirings 72a and 72b. With this constitution, the difference in height between a portion on which the connection wirings 72a and 72b exist and a portion on which the connection wirings 72a and 72b do not exist can be suppressed. As a result, it is possible to avoid a malfunction such as the disconnection of a connection wiring (not shown) formed on an upper layer.

Meanwhile, the dummy pattern 73 is usually formed in a solid manner on a portion on which the connection wirings 72a and 72b do not exist. The area of the pattern 73 is considerably large compared with that of the connection wirings 72a and 72b. To constitute a multilayer wiring structure, patterning by means of exposure photolithography is repeated. If the connection wirings 72a, 72b and the dummy pattern 73 have such a relationship in size, a difference in surface reflection quantity occurs between the connection wirings and the dummy pattern during exposure. It is empirically known that the gap (space) between the connection wirings and the dummy pattern tends to be narrower than that between the connection wirings according to the difference in surface reflection quantity. If the gap is narrowed, short defects tends to occur between the connection wirings and the dummy pattern. If aluminum alloy is used as a material for the connection wirings, in particular, hillock (aluminum solid-phase growth) may possibly occur by a heat treatment during process. As a result, short defects may occur more frequently between the connection wirings and the dummy pattern.

Moreover, in the semiconductor device having the above-described multilayer wiring structure, a dummy pattern is normally in a floating state in which the dummy pattern is electrically isolated. In this state, the potential of the dummy pattern is unstable and there is near that wiring delay may occur to adjacent connection wirings due to the unstable potential.

SUMMARY OF THE INVENTION

The present invention has been made in view of the above-stated technical disadvantages and it is, therefore, an object of the present invention to provide a semiconductor device capable of suppressing a short defect between a dummy pattern and a connection wiring.

It is another object of the present invention to provide a semiconductor device capable of ensuring the good potential stability of a dummy pattern.

To accomplish these objects, in a first aspect of the present invention, there is provided a semiconductor device having a multilayer wiring structure in which a plurality of layers are formed on a substrate and in which predetermined elements and a connection wiring for electrically connecting the predetermined elements are formed on each layer, characterized in that a dummy pattern almost as high as the connection wiring is provided in a predetermined region of each layer so that an outer peripheral portion of the dummy pattern is adjacent to the connection wiring; and the dummy pattern is formed linearly at least on the outer peripheral portion, and a distance between a linearly formed portion and a portion inside of the linearly formed portion is set to be equal to or narrower than a distance between the connection wiring and the linearly formed portion.

In a second aspect of the present invention, the dummy pattern has another linearly formed portion inside of the linearly formed portion on the outer peripheral portion.

Further, in a third aspect of the present invention, the dummy pattern is provided on both sides of an isolated connection wiring.

Moreover, in a fourth aspect of the present invention, constituent portions of the dummy pattern are connected to the substrate through conductive contacts, respectively.

Additionally, in a fifth aspect of the present invention, constituent portions of the dummy pattern are connected to a connection wiring formed on an upper layer of the layer on which the dummy pattern is formed, through conductive contacts, respectively.

DESCRIPTION OF THE PREFERRED EMBODIMENTS

The embodiments of the present invention will be described hereinafter with reference to the accompanying drawings. A semiconductor device to be described herein has a multilayer wiring structure in which a plurality of layers are provided on a substrate and predetermined elements and a connection wiring for electrically connecting the elements are formed on each layer.

Embodiment 1

Figure 1:
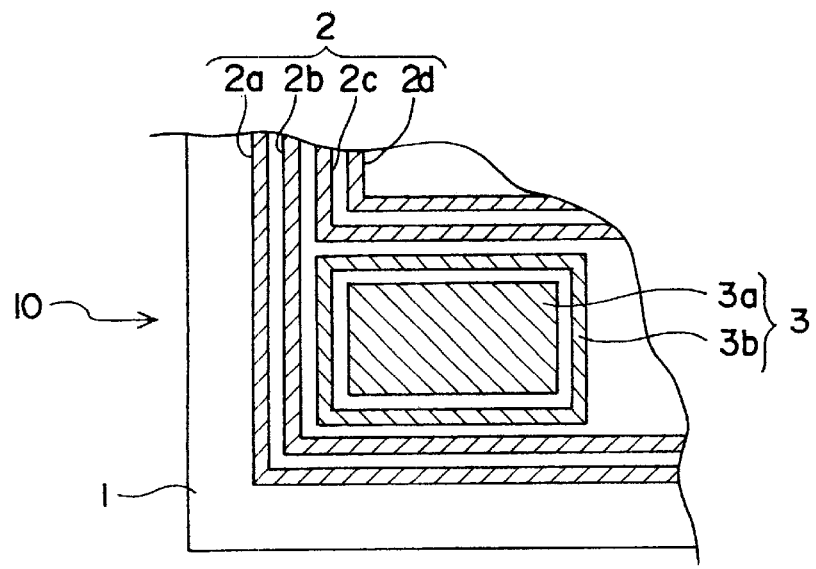
FIG. 1 is a plan view schematically showing part of a wiring structure inside a semiconductor device according to Embodiment 1 of the present invention.

FIG. 1 is a plan view showing part of a wiring structure inside a semiconductor device according to Embodiment 1 of the present invention. On a base surface 1 of a layer provided in the semiconductor device 10, a plurality of connection wirings 2 (2a, 2b, 2c and 2d) are formed at predetermined intervals to connect various elements (not shown) incorporated in the device. As a material for these connection wirings 2, aluminum alloy is used as is ordinarily used with a conventional technique.

A dummy pattern 3 almost as high as the connection wirings 2 is provided in an empty region, in which the connection wirings 2 and the elements do not exist, on the base surface 1 of the layer. The dummy pattern 3 is provided so that the outer peripheral portion of tie dummy pattern 3 is adjacent to the connection wirings 2b and 2c defining the empty region. By providing so, no difference in height between a portion on which the connection wirings 2 exist and a portion on which the connection wirings 2 do not exist, occurs on the base surface 1 and it is possible to avoid the disconnection of a connection wiring (not shown) formed on the upper layer of the constitution of the base surface 1.

In this embodiment 1, the dummy pattern 3 consists of a solid portion 3a formed in a solid manner and a linear portion 3b formed linearly around the solid portion 3a. The distance between the solid portion 3a and the linear portion 3b is set to be equal to or narrower than the distance between the connection wirings 2b, 2c and the linear portion 3b.

With this structure, the distance (space) between the linear portion 3b and the solid portion 3a is narrower than that between the connection wirings 2b, 2c and the linear portion 3b. Due to this, in case of conducting patterning by means of exposure photolithography, it is possible to limit the possibility of the occurrence of short defects only between the linear portion 3b and the solid portion 3a, i.e., within the dummy pattern 3. As a result, the semiconductor device 10 can enhance the margin of short defects between the dummy pattern 3 and the connection wirings 2 and improve the deterioration of yield resulting from the short defects. Further, even if aluminum alloy is used as a material for the connection wirings 2 and hillock occurs to the surfaces of the connection wirings, it is possible to sufficiently suppress short defects between the connection wirings and the dummy pattern.

In Embodiment 1, description has been given to the connection wirings 2 and the dummy pattern 3 formed on the base surface 1 of a specific layer provided in the semiconductor device 10. This also applies to the respective layers constituting the multilayer wiring structure.

Next, other embodiments of the present intention will be described. It is noted that the same constituent elements in the following embodiments is those in Embodiment 1 are denoted by the same reference symbols, which constituent elements will not be described herein

Embodiment 2

Figure 2:
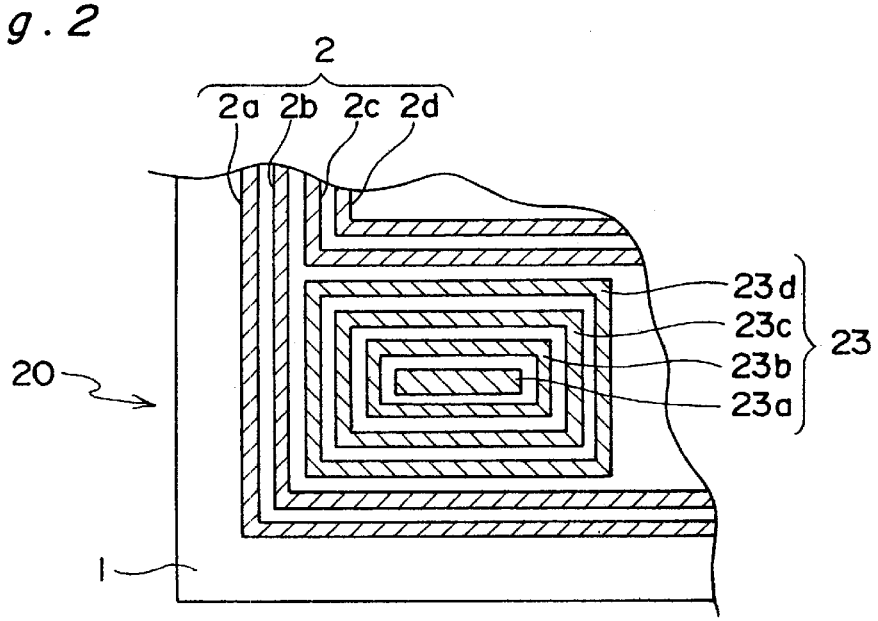
FIG. 2 is a plan view schematically showing part of a wiring structure inside a semiconductor device according to Embodiment 2 of the present invention.

FIG. 2 is a plan view schematically showing part of a wiring structure inside a semiconductor device according to Embodiment 2 of the present invention. As in the case of Embodiment 1 described above, a dummy pattern 23 almost as high as connection wirings 2 is provided in an empty region, in which the connection wirings 2 and elements do not exist, on the base surface 1 of a layer provided in a semiconductor device 20. In Embodiment 2, the dummy pattern 23 consists of a linear portion 23d serving as an outer peripheral portion of the pattern 23, a linear portion 23c inside of the linear portion 23d, a linear portion 23b inside of the portion 23c, and a solid portion 23a formed in a solid manner at the center of the pattern 23. The distance between the linear portions and that between the linear portion 23b and the solid portion 23a are set to be equal to or narrower than the distance between the connection wirings 2 and the linear portion 23b.

With this structure, the space between the respective linear portions and that between the linear portion 23b and the solid portion 23a are narrower than that between the connection wirings 2b, 2c and the linear portion 23d. Due to this, in case of conducting patterning by means of exposure photolithography, it is possible to ensure limiting the possibility of the occurrence of short defects between the linear portions and between the linear portion 23b and the solid portion 23a, i.e., within the dummy pattern 23. As a result, it is possible to further improve the margin of short defects between the dummy pattern 23 and the connection wirings 2 in the semiconductor device 20. Even if shrink (contraction) progresses between, for example, the connection wirings 2, it is possible to suppress short defects from occurring between the connection wirings 2.

Embodiment 3

Figure 3:
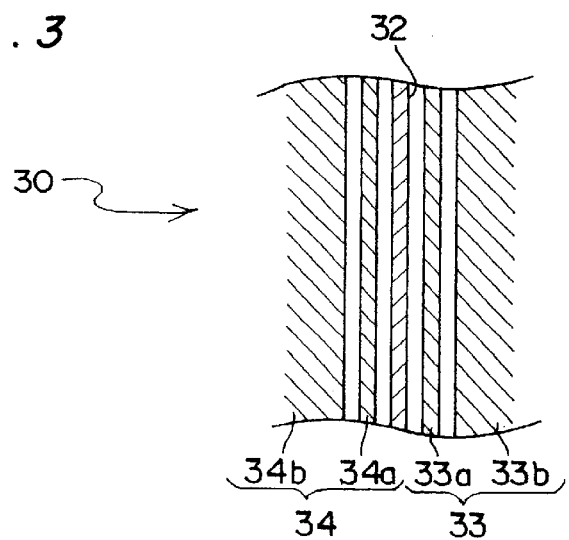
FIG. 3 is a plan view schematically showing part of a wiring structure inside a semiconductor device according to Embodiment 3 of the present invention.

FIG. 3 is a plan view schematically showing part of a wiring structure in a semiconductor device according to Embodiment 3 of the present invention On the base surface 1 of a layer provided in this semiconductor device, one connection wiring 32 is formed in an isolated manner. In Embodiment 3, dummy patterns 33 and 34 are formed on both sides of the connection wiring 32, respectively. These dummy patterns 33 and 34 consist of linear portions 33a, 34a formed linearly and solid portions 33b, 34b formed in a solid manner, respectively. Each of the dummy patterns 33 and 34 is formed linearly on the outer peripheral portion, i.e., at side at which the dummy is adjacent to the connection wiring 32. In each of the dummy patterns 33 and 34, the distance between the linear portion 33a or 34a and the solid portion 33b or 34b is set to be equal to or narrower than the distance between connection wiring 32 and the linear portion 33a or 34a.

With this structure, the space between the linear portion 33a or 34a and the solid portion 33b or 34b is narrower than the space between the connection wiring 32 and the linear portion 33a or 34a. Due to this, in case of conducting patterning by means of exposure photolithography, the possibility of the occurrence of short defects can be limited between the linear portions 33a, 34a and the solid portions 33b, 34b, i.e., within the dummy patterns 33 and 34. As a result, it is possible to improve the margin of short defects between the dummy patterns 33, 34 and the connection wiring 32.

Embodiment 4

Figure 4:
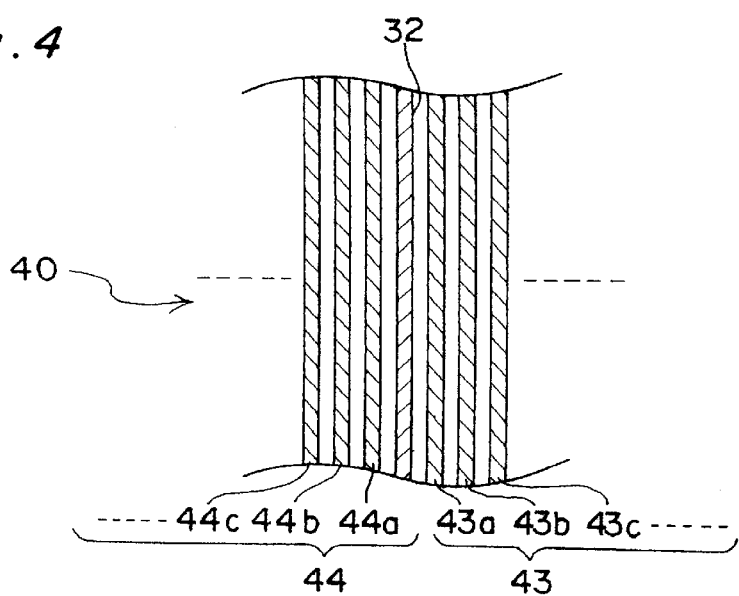
FIG. 4 is a plan view schematically showing part of a wiring structure inside a semiconductor device according to Embodiment 4 of the present invention.

FIG. 4 is a plan view schematically showing part of a wiring structure in a semiconductor device according to Embodiment 4 of the present invention. As in the case of Embodiment 3 described above, one connection wiring 32 is formed in an isolated manner on the substrate 1 of a semiconductor device 40. Dummy patterns 43 and 44 are provided at both sides of the connection wiring 32, respectively. In Embodiment 4, the dummy patterns 43 and 44 consist of linear portions 43a, 44a formed linearly, linear portions 43b, 44b inside of the linear portions 43a, 44a, linear portions 43c, 44c inside of the linear portions 43b, 44b and linear portions (indicated by broken lines) further inside. In each of the dummy patterns 43 and 44, the distance between the linear portions is set to be equal to or narrower than the distance between the linear portion 43a or 44a and the connection wiring 32.

With this structure, the space between the linear portions is narrower than the space between the connection wiring 32 and the linear portion 43a or 44a. Due to this, in case of conducting patterning by means of exposure photolithography, the possibility of the occurrence of short defects can be limited between the linear portions, i.e., within the dummy patterns 43 and 44. As a result, in the semiconductor device 40, it is possible to improve the margin of short defects between the dummy patterns 43 and 44 and the connection wiring 32.

Embodiment 5

Figure 5:
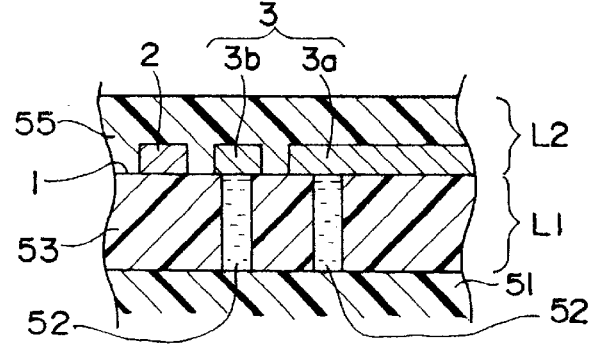
FIG. 5 is a longitudinal sectional view schematically showing part of a wiring structure inside a semiconductor device according to Embodiment 5 of the present invention.

FIG. 5 is a longitudinal sectional view schematically showing part of a wiring structure in a semiconductor device according to Embodiment 5 of the present invention. In FIG. 5, two layers L1 and L2 provided on the substrate 51 of a semiconductor device 50 are shown. The ranges of these layers L1 and L2 are defined by interlayer insulating films 53 and 55, respectively. The interlayer films 53 and 55 seal the constituent elements (e.g., elements and connection wirings) contained in the respective lakers L1 and L2. On the layer L2, a dummy pattern 3 having a linearly formed outer peripheral portion is provided to be adjacent to a connection wiring 2 as in the case of Embodiment 1 described above. In this case, the upper surface of the layer L1 become the base surface 1 of the layer L2 on which the connection wiring 2 and the dummy pattern 3 are arranged.

In Embodiment 5, a solid portion 3a and a linear portion 3b which constitute the dummy pattern 3 on the layer L2 are connected to the substrate 51 through conductive contacts 52, respectively. With this structure, it is possible to prevent the solid portion 3a and the linear portion 3b, which constitute the dummy pattern 3, from being electrically isolated and turning into a floating state and to thereby keep the potential of the dummy pattern 3 stable. As a result, it is possible to avoid the occurrence of wiring delay based on the unstable potential of the dummy pattern 3.

Embodiment 6

Figure 6:
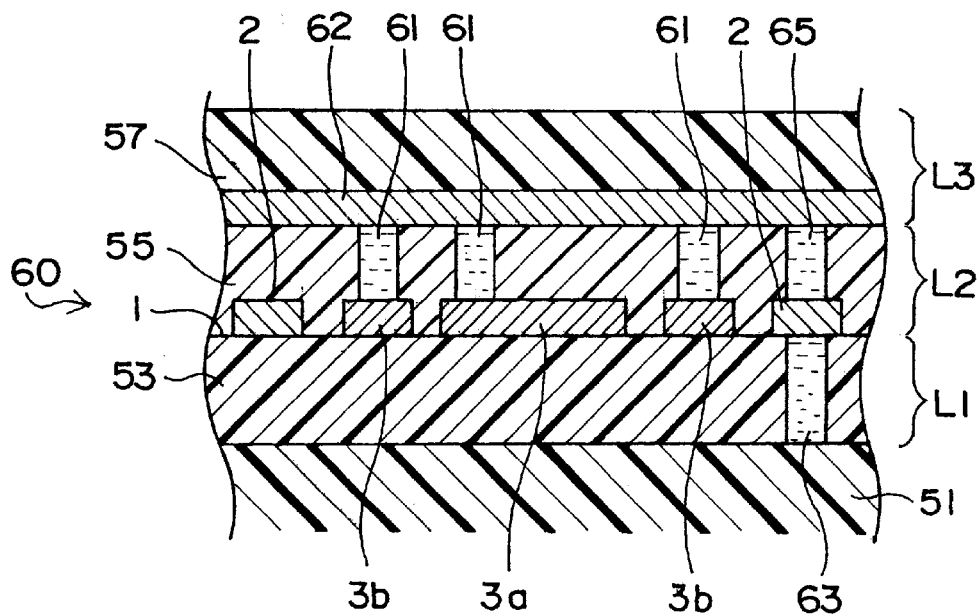
FIG. 6 is a longitudinal sectional view schematically showing part of a wiring structure inside a semiconductor device according to Embodiment 6 of the present invention.
Figure 7:
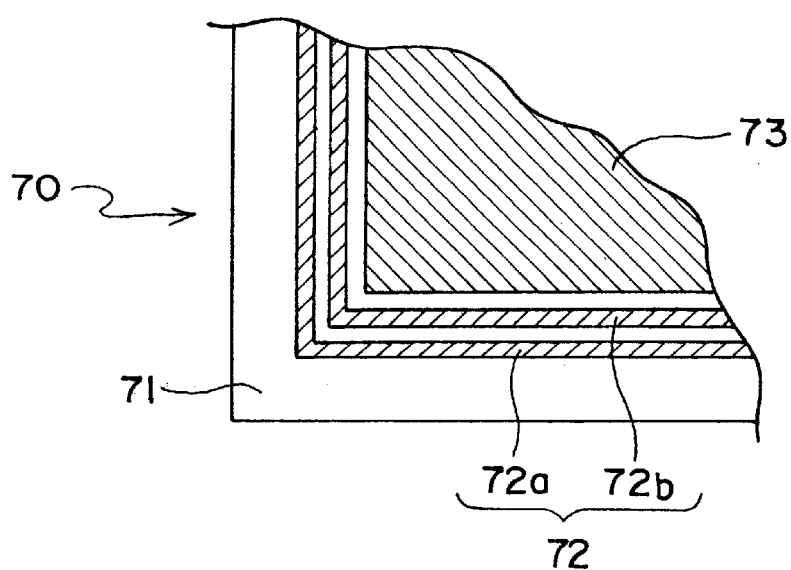
FIG. 7 is a plan view schematically showing part of a wiring structure inside a conventional semiconductor device.

FIG. 6 is a longitudinal sectional view schematically showing part of a wiring structure in a semiconductor device according to Embodiment 6 of the present invention. In FIG. 6, three layers L1, L2 and L3 provided on the substrate 51 of a semiconductor device 60 are shown. As in the case of Embodiment 5 described above, the ranges of these layers L1, L2 and L3 are defined by interlayer insulating films 53, 55 and 57, respectively. The interlayer films 53, 55 and 57 seal constituent elements (e.g., elements and connection wiring) contained in the respective layers L1, L2 and L3. A dummy pattern 3 having an outer peripheral portion formed linearly is provided on the layer L2 to be adjacent to the connection wiring 2 as in the case of Embodiment 1 described above.

In Embodiment 6, the solid portion 3a and the linear portion 3b which constitute the dummy pattern 3 are connected to a connection wiring 62 formed on the layer L3 above the layer L2 on which the dummy patters 3 is formed, through conductive contacts 61, respectively. In addition, in this case, the connection wiring 2 on the layer L2 is connected to the substrate 51 and to the connection wiring 62 on upper the layer L3 through contact elements 63 and 65, respectively.

With this structure, it is possible to prevent the solid portion 3a and the linear portion 3b, which constitute the dummy pattern 3, from being electrically isolated and turning into a floating state, and to thereby keep the potential of the dummy pattern 3 stable. As a result, it is possible to avoid the occurrence of wiring delay based on the unstable potential of the dummy pattern 3.

Needless to say, the present invention should not be limited to the embodiments illustrated so far and various improvements and design changes can be made within the scope of the present invention.

As is obvious from the above description, according to the present invention, a narrower space is formed in the dummy pattern than the space between the connection wiring and the dummy pattern, and therefore, in case of conducting patterning by means of exposure photolithography, the possibility of the occurrence of short defects can be limited within the dummy pattern. As a result, in the semiconductor device, the margin of short defects between the dummy pattern and the connection wiring can be improved and the deterioration of yield resulting from the short defects can be improved.

Further, according to the present invention, it is possible to prevent the respective constituent portions from being electrically isolated and turning into a floating state and to keep the potential of the dummy pattern stable. As a result, it is possible to prevent the occurrence of wiring delay based on the unstable potential of the dummy pattern.

What is claimed is:

1. A semiconductor device having a multilayer wiring structure in which a plurality of layers are formed on a substrate and in which predetermined elements and a connection wiring for electrically connecting the predetermined elements are formed on each layer, wherein a dummy pattern almost as high as the connection wiring is provided in a predetermined region of at least one of the layers, which comprises a linearly formed outer peripheral pattern and an inner pattern formed inside said outer peripheral pattern so that its perimeter runs along said outer peripheral pattern; and a distance between said outer peripheral pattern and said inner pattern is set to be equal to or narrower than a distance between the connection wiring and said outer peripheral pattern.

2. A semiconductor device according to claim 1, wherein said inner pattern is further linearly formed.

3. A semiconductor device according to claim 1, wherein the dummy pattern is provided on both sides of an isolated connection wiring.

4. A semiconductor device according to claim 1, wherein constituent portions of the dummy pattern are connected to the substrate through conductive contacts, respectively.

5. A semiconductor device according to claim 1, wherein constituent portions of :he dummy pattern are connected to a connection wiring former on an upper layer of the layer on which the dummy pattern is formed, through conductive contacts, respectively.

* * * * *